US006614225B1

(12) United States Patent
Feinberg

(10) Patent No.: US 6,614,225 B1
(45) Date of Patent: Sep. 2, 2003

(54) SIMULTANEOUS IMAGE REFOCUSING

(75) Inventor: David Feinberg, 6926 Waterman Blvd., University City, MO (US) 63130

(73) Assignee: David Feinberg

( * ) Notice: Subject to any disclaimer, the term of this patent is extended or adjusted under 35 U.S.C. 154(b) by 0 days.

(21) Appl. No.: 09/477,783

(22) Filed: Dec. 31, 1999

Related U.S. Application Data

(60) Provisional application No. 60/168,879, filed on Dec. 3, 1999.

(51) Int. Cl.[7] ................................................. G01V 3/00
(52) U.S. Cl. ...................................................... 324/307
(58) Field of Search ................................. 324/307, 309

(56) References Cited

U.S. PATENT DOCUMENTS

| | | | | |
|---|---|---|---|---|
| 5,109,854 A | * | 5/1992 | Provost | 324/309 |
| 5,311,133 A | * | 5/1994 | Dannels | 324/307 |
| 5,341,098 A | * | 8/1994 | Hennig | 324/309 |
| 5,378,985 A | * | 1/1995 | Hinks | 324/307 |
| 5,548,216 A | * | 8/1996 | Dumoulin et al. | 324/309 |
| 5,568,050 A | | 10/1996 | Hennig | |
| 5,578,924 A | * | 11/1996 | Dumoulin et al. | 324/309 |
| 6,034,528 A | * | 3/2000 | Heid | 324/309 |
| 6,127,824 A | * | 10/2000 | Sydney Smith et al. | 324/300 |
| 6,208,136 B1 | * | 3/2001 | Smith et al. | 324/300 |
| 6,256,526 B1 | * | 7/2001 | Butts et al. | 324/307 |

OTHER PUBLICATIONS

T. Loenneker, F. Hannel. J. Hennig, Multislice Interleaved Excitation Cycles (MUSIC): An Efficient Gradient–Echo Technique for Functional MRI, MRM 35:870–874 (1996).

D.A. Feinberg, T.G. Reese, V.J. Wedeen, "Simultaneous Image Refocusing (SIR): a New Approach to Multi–slice MRI".

David Feinberg, Ph.D, and Jürgen Hennig, Ph.D., International Society For Magnetic Resonance In Medicine, Fast MRI Workshop: Methodological Perspectives and Advances in Cardiac, Neuro, Angiography and Abdominal Imaging, SYLLABUS, Oct. 27–29, 1997, Asilomar Conference Center, Monterey, California, USA, pp. 1–5.

J.E. Bishop and D.B. Plewes, Ph.D. "A New Multi–slice Technique Based on TE–Interleaving" p. 437.

J. Hennig, "Basic Concepts of Burst", p. 126–128.

Peter M. Joseph, "Principles of Image Formation", Magnetic Resonance Imaging of the Brain and Spine, Second Edition, ed by Scott W. Atlas, Lippincott–Raven Publishers, Philadelphia 1996, pp. 49–54.

P. Brunner and R.R. Ernst, "Sensitivity and Performance Time in NMR Imaging", pp. 83–106.

* cited by examiner

*Primary Examiner*—Edward Lefkowitz
*Assistant Examiner*—Dixomara Vargas
(74) *Attorney, Agent, or Firm*—Cooper & Dunhamm, LLP.

(57) ABSTRACT

Multiple signals are excited at different slice positions and then refocused simultaneously. The resulting MRI signals from two or more slices are acquired during a unipolar gradient read period. Then, the signals can be simultaneously refocused in additional unipolar read periods for echo train imaging. In general, signals from multiple slices created by selective RF excitation are read-out on a read gradient.

19 Claims, 12 Drawing Sheets

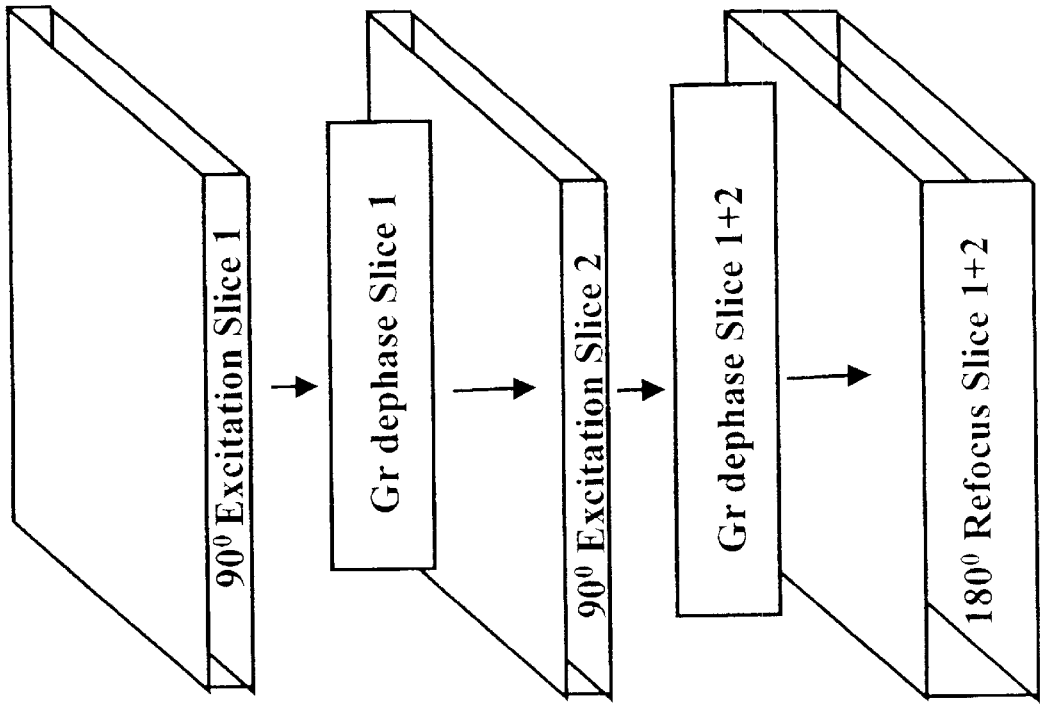

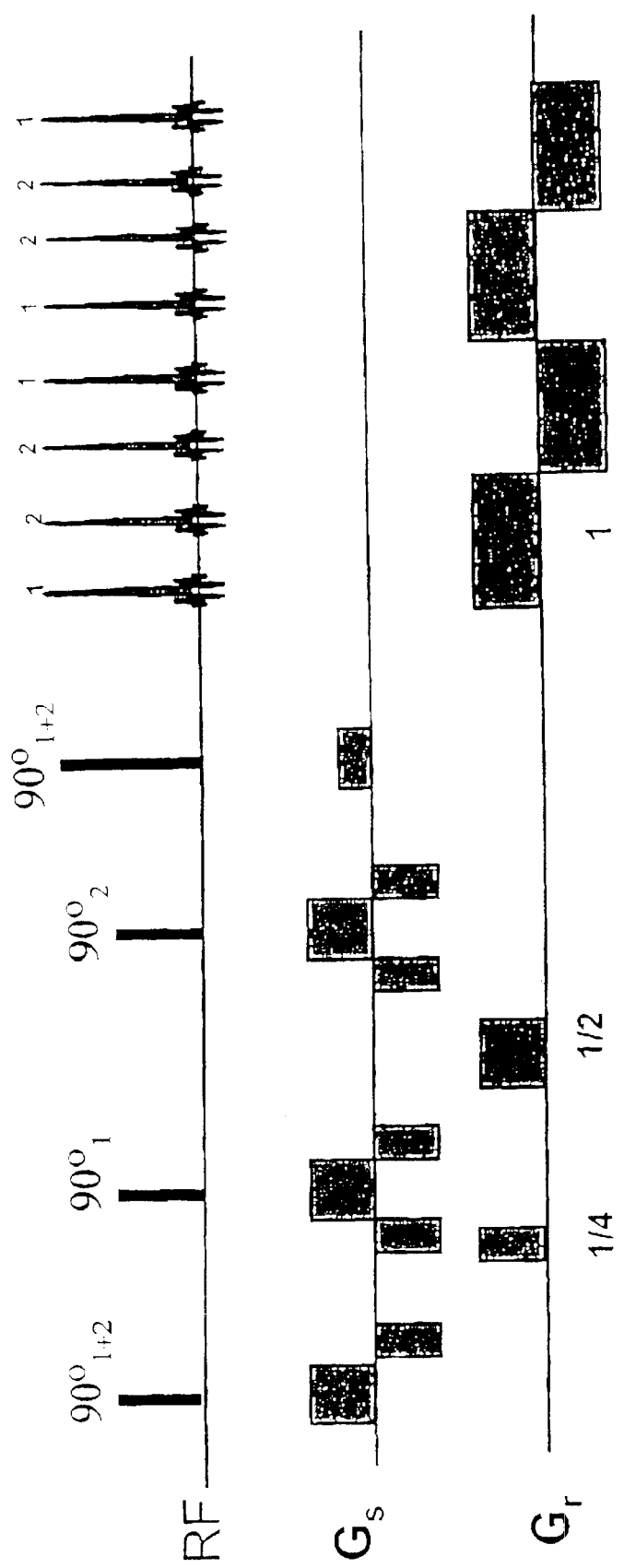
Fig.9 Stimulated echo sequence

SIMULTANEOUS IMAGE REFOCUSING

This application is based on, and claims the benefit of the filing date of, the provisional application bearing the same title, filed by the same inventor on Dec. 3, 1999 and assigned Ser. No. 60/168,879, and hereby incorporates by reference the contents of the provisional application.

FIELD

This patent specification is in the field of magnetic resonance imaging (MRI) using pulse sequences such as sequences making use of slice selective radiofrequency (RF) pulses.

BACKGROUND

Pulse sequences can be repeated with different RF pulse frequency to give resonance at different positions on a magnetic gradient to accomplish multi-slice coverage. Mansfield has described use of slice selective excitation. To increase signal recovery by T1 for higher SNR in images, Ernst has proposed that multiple slice planes can be obtained within the same repetition time (TR) of the sequence. In spin echo (SE) imaging, Crooks has proposed applying, within the same TR, frequency offsets to RF pulses (90° and 180°) to accomplish multi-slice imaging, and this method is commonly used currently for many other types of pulse sequences. Some are known under the names gradient echo (GR), FLASH, EPI, SE-EPI, RARE, TSE, FSE, GRASE, BURST, and stimulated echo imaging.

The efficient interleaving of slices within the same TR of a SE sequence can, if time permits, be applied to interleaving of slices within the same TE, as proposed by Bishop in T2-weighted SE imaging. See Bishop, J. E. and Plewes, D. B. (Department of Medical Biophysics, University of Toronto), A new Multi-slice Technique Based on TE-Interleaving. The large time delays between RF pulses and SE signal can by utilized to record additional slices by interleaving multiple complete sequences of the 90° and 180° RF pulses, applied with different frequency offsets to independently excite and independently refocus signals from different slices within a shared TE time interval.

A very different method called BURST uses a set of low flip angle RF pulses applied on the same slice. This generates signals from fragments of the total magnetization. These fragmented or BURST signals are refocused with a constant unipolar gradient. The BURST technique creates an image extremely fast; however, the image is intrinsically lower in SNR than echo train sequences such as EPI or RARE. Unlike BURST, which refocuses fractions of the slice magnetization in each signal, the EPI and RARE sequences refocus the slice's total magnetization into multiple signals.

SUMMARY

An MRI process in accordance with the disclosure herein gives each of a number of excited slices a respective phase history different from those of the other slices. The process then simultaneously refocuses these slices, and acquires the MRI signals from them at respective different times related to the respective different phase histories of the respective slices. These MRI signals can be used as known to reconstruct respective images of the slices. This process can be called Simultaneous Image Refocusing (SIR).

For example, two consecutive 90° RF excitation pulses at respective frequencies create magnetization in two slices s1 and s2 of a body, such as by using the known MRI practice of employing a main magnetic field and a slice selection gradient field acting on a body. A first dephasing pulse, on a readout axis Gr, is applied after the first but before the second 90° RF pulse, thereby encoding the magnetization of the first slice (s1) but not of slice s2 since the second slice magnetization has not yet been created. A second dephasing pulse, on the same axis Gr, is applied after both slices have been magnetized by their respective 90° FR pulses and, therefore, encodes the magnetization of both slices equally. This gives the two slices respective different phase histories relative to the Gr direction. If the subsequent readout pulses on the Or gradient axis are of unit area, and the first and second dephasing pulses on the Gr axis have areas of 0.50 and 0.25, respectively, the magnetization pathways they produce in the two slices will refocus echoes (MRI signals) within opposite halves of each read period, alternating with each EPI (echo planar imaging) gradient switching, due to the respective different phase histories of the two slices relative to the read gradient direction.

As one example, with equal signal bandwidth in conventional EPI (single slice) and SIR EPI (two slices), the echo trains are 30 ms and 45 ms, respectively, for 64 readout periods with linear phase encoding on a 1.5 T MRI scanner.

A significant advantage of the SIR pulse sequence disclosed herein is that it reduces the number of gradient switchings that cause physiologic neurostimulation and thereby impose performance limits on MRI data acquisition. When applied to EPI sequences, SIR with simultaneous refocusing of two slices improves the threshold to physiologic stimulation (pain) by a factor of approximately two. As is known, when conventional EPI is performed with very high performance gradients (high maximum (dB/dx) at greater net slew rate (dB/dx/dt) in the sequence) the neurostimulation of the body rather than gradient performance limits the data acquisition rate and number of slices imaged.

In pulse sequences such as RARE, and to some degree GRASE, typically 180° RF pulses are used to refocus the signals, and RF dependent heating of the body ultimately limits the imaging speed and limits the number of slices acquired during an image sequence. In RARE there typically is a one-to-one relationship between the number of signals and 180° RF pulses. An advantage of the SIR technique applied to RARE sequences, when for example two slices are acquired in a read period, is to reduce to half the number of 180° degree RF pulses per slice. This greatly reduces RF heating of the body and therefore permits faster image acquisition using a shorter TR or a larger number of slices in the same time as RARE, or tradeoffs of shorter TR or more slices in the same time period.

While for simplicity most examples discussed herein involve two simultaneously refocused slices, it should be clear that when more than two slices are encoded simultaneously in SIR, there is a further reduction of RF heating per slice. It should also be clear that the techniques described herein as applied to slices can be applied to volumes having a greater thickness than that of a typical MRI slice, and that the multiple simultaneously refocused slices need not be parallel to each other, and need not be perpendicular to a longitudinal axis of the MRI magnet. Each slice in SIR can be at its own angle in space, defined for example by the known technique of using a respective combination of concurrent gradients along different axis.

After SIR EPI data acquisition of two slices, "time reversal" of data on alternate polarity read gradients separates data from the two slices onto two halves of the frequency axis of k-space. This acquired k-space is separated into two k-spaces, by directly dividing it in half on the frequency axis. Another method of separating the k-spaces is by a deconvolution method which separates the high spatial frequency k-space data overlapping in time. In fact, there is an extension of the two highest resolution regions of k-space of two slices, or leakage of low amplitude, highest spatial frequency k-space data between the two slices k-space.

Phase alternation of one of the two 90° RF excitation pulses can be used in two acquisitions of the same sequence to create a polarity change in one of the two simultaneously acquired slices' k-space. Taking different linear combinations (i.e. adding or subtracting) the two phase alternating data sets nulls data from one or the other slice. The resulting highest spatial frequency data can therefore be utilized in a larger k-space data matrix with advantages of higher spatial resolution, higher SNR/unit volume, and more complete separation of signal leakage between two simultaneously acquired slices. Another similar approach to obtaining different combinations and dependent manipulation of signals is to change the order of slice excitation with the 90° pulses in multiple average acquisitions (i.e., multiple acquisitions of the entire imaging sequence). This produces different linear combinations of k-space overlaps, allowing for separation of k-spaces of different slices.

Applied to RARE type sequences, SIR uses at least two different slice selective pulses, typically but not necessarily of 90° each but at different frequencies, $f_1$ and $f_2$; however, a single refocusing pulse, typically of 180°, centered at $(f_1+f_2)/2$ is used with broader slice profile which overlaps onto the positions of the excitation slices and so the 180° pulse refocuses both slices simultaneously. In the longer echo train, the signals of the two slices alternate in their refocused position in each read gradient. With appropriate timing between the RF pulses and appropriate Gr dephasing pulses, all the signals can be acquired with nulling of field inhomogeneity and susceptibility errors. With this approach in SIR, two or more spin echoes can be refocused between each pair of 180° pulses, rather than a gradient echo and spin echo. Given the alternating order of the slice signal pairs, the T2 decay curve is sampled discontinuously rather than incrementally in time. Discontinuous sampling of the T2 decay curve in the GRASE sequence, has shown that discontinuous sampling does not create image artifacts nor does it significantly change the image contrast. The CPMG timing of spin echoes from the two slices is replaced with an alternating short and long 90°–180° time interval; nevertheless, all signals are spin echoes. The initial three RF pulses therefore do not have CPMG timing; however, this timing has been tested and it does not create interference between spin echoes and stimulated echoes. The resulting image acquisition uses half the number of 180° RF pulses, which reduces body heating and permits twice the number of slices or a net faster image acquisition.

Bandwidth of signals increases when they are sampled more quickly in the SIR sequence disclosed herein, without changing the duration of the read period from that in the otherwise similar conventional RARE or EPI sequence. With implementation of simultaneous image refocusing in EPI or RARE, there is increased net ADC sampling time per total sequence time. In the exemplary two slice SIR EPI, there are half as many read gradient switchings in acquiring two slices. In RARE there are half the number of Gp phase encode pulses, Gp rewind pulses and 180° RF pulses in the case of simultaneously refocusing two slices. If signal bandwidth is maintained the same as in a conventional sequence, due to the above reduction of RF and gradient pulses the total data acquisition of two slices is reduced. For example, an EPI image is encoded in an echo train of 30 milliseconds and with SIR two EPI images are encoded in a 45 millisecond echo train. When EPI is used for functional MRI, BOLD contrast is created using a 30 millisecond delay between the excitation 90° pulse and the echo train for a total of 60 milliseconds per slice. Using SIR, two slices are encoded in 75 milliseconds. With merely 25% longer acquisition time, SIR gives two BOLD weighted images instead of one. The average speed of multi-slice EPI imaging is increased substantially; however, this must be adjusted or optimized with the associated effects of increased echo spacing and increased T2* decay which increase distortions and susceptibility artifacts, especially in gradient echo EPI.

With the SIR technique, total imaging time is reduced even more when any "preparatory period" is used. The preparatory period is when gradient pulses, delay time or RF pulses are incorporated into the sequence to encode physiologic or physical information in the image. One commonly used pulse sequence preparation is the Stejskl-Tanner gradient pulse sequence used to obtain diffusion weighted (DW) EPI imaging. The DW preparatory period requires a relatively large proportion of sequence time, 80 to 100 milliseconds, on current clinical MR scanners. The total acquisition time of each single shot DW SE-EPI image is about 150 milliseconds. With the simultaneous imaging sequence (SIR) disclosed herein, the time of two DW EPI images would be approximately 180 milliseconds as they would simultaneously share a DW preparatory period.

In the case of a preparatory period encoding velocity of blood or motion in general, there is the advantage of obtaining a measure of velocity in multiple slices at the same time. This eliminates or greatly reduces inaccuracies due to changes in position and in velocity due to pulsating or respiratory motion in the body. Such simultaneous velocity images are obtained by using a bipolar gradient pulses, Stejskl-Tanner gradients, or other gradient pulses in the preparatory period.

SIR can also be applied to stimulated echo sequences. In a conventional stimulated echo (STE) sequence, a first 90° RF pulse excites a slice, a second 90° RF pulse stores the signal on the longitudinal axis, where the gradient pulses cannot encode the signal, and a third 90° RF pulse returns the signal to the transverse axis, where gradients can encode the signal and the signal can be read with Gr gradients.

When SIR is applied to an STE sequence, in the case of two slices s1 and s2, a first RF pulse that typically is 90° excites both slices. A first Gr dephasing gradient encodes the signals from both slices. A second, more selective 90° pulse stores the signal from slice s1 but not from slice s2 on the longitudinal axis. A second Gr dephasing gradient is applied and encodes only the signal from slice s2 (because slice s1 has experienced two 90° pulses and is stored on the longitudinal axes). A third 90° pulse stores the signal from slice s2 on the longitudinal axis. A fourth 90° pulse affecting both slices s1 and s2 returns to the transverse axis (or refocuses) the signals from both slices s1 and s2. The signals can be read out by EPI alternation of Gr polarity, creating an alternating order of signals from slices s1 and s2. Additional Gp slice encoding gradients can be applied during the echo train, in the conventional way, to encode each set of signals from s1 and s2 differently for 2D FT. This method of SIR STE can be generalized to more than two simultaneously refocused slices. Also, the order of Gr encoding can be changed, e.g., the first Gr dephasing pulse can be applied with opposite polarity immediately after the fourth 90° pulse and have same or comparable effect.

The simultaneous images refocused (SIR) technique is believed to be most successful, at least in part, because of three preferred features of the exemplary image sequence (which may be performed in various subcombinations and permutations).

I. Echo Generation

First, as previously mentioned, a set of slice selective RF excitation pulses creates signals present together in the pulse sequence. Different combinations of dephasing gradient pulses on the Gr axis are applied between the excitation RF pulses. These Gr pulses give the signals different phase history. Different linear combinations of net Gr dephasing are possible because of two fundamental principles: 1) gradient effects are not encoded in the signal from a slice if the gradient pulse is applied before the slice's selective RF excitation, and 2) a Gr pulse applied after the time of all of the slice selective RF excitations causes dephasing of signal equally in all slices. Specific linear combinations of dephasing Gr pulses allow the signals from different slices to be moved to different locations on a read gradient so that the signals are not superimposed in time.

In some situations it may also be desirable to create different k-space phase encoding ordering in different slices which can also be established by applying different phase gradient pulses (Gp) between the excitation RF pulses. In general terms, gradient pulses applied after all of the RF excitations of slices encode all slices equally and simultaneously, whereas gradient pulses applied between the RF excitation pulses encode only the earlier excited slices.

II. Echo Refocusing

The echoes from different slices are simultaneously refocused by switching the polarity of read gradients as in EPI or by RF refocusing pulses. The RF refocusing pulse can be simultaneously experienced on all image planes by making it broader in width than the excitation pulses onto which it overlaps. The Gp phase encode pulses encode the slices simultaneously. There is a significant reduction in the amount RF energy absorbed by the body as compared with RARE or GRASE sequences because a fractional number of 180° RF pulses is needed to create the same number of image slices.

III. Preparation Period

The encoding of different physiologic or physical information in the image; i.e., diffusion, velocity or brain activation with blood oxygen level dependence (BOLD) contrast, occurs in a preparation period (PP) in the pulse sequence prior to signal readout. In SIR technique, the PP is applied simultaneously to multiple slices. This reduces the number of PP periods by a factor equal to the number of simultaneous images. In the case of BOLD and Diffusion PP there is a large time saving. In velocity, the physiologic measurements is made simultaneously in 3D space (two adjacent slice planes) rather than in 2D image. This gives temporal coherence of velocity information in the presence of cardiac and respiratory dependent motions of the human body's organs, blood and cerebrospinal fluid.

The above description of SIR technique is general to both multi-slice 2D FT imaging and multi-volume 3D FT imaging, with the above three principles generally applicable to both closely related imaging methods. Furthermore, the images and their preparatory information are not required to be constrained as parallel in space as they can be oriented in any angle in three dimensional space by simultaneously applying different gradients creating different vector components of three dimensional space for slice selective excitation, readout or other encodings.

The description of the SIR technique is general to different flip angles of RF excitation pulses and RF refocusing pulses. Throughout the description of SIR technique, 90° excitation pulses and 180° refocusing pulses are used in an exemplary fashion.

In this general description of the SIR technique, constant amplitude read gradients (Gr) are used; however, variations in the Gr pulse can be performed, for example, to create differences in signals bandwidths.

BRIEF DESCRIPTION OF THE DRAWINGS

FIG. 8 illustrates timing of events.

FIG. 9 illustrates SIR applied to a stimulated echo sequence.

Preferred Embodiments

Figure 1:
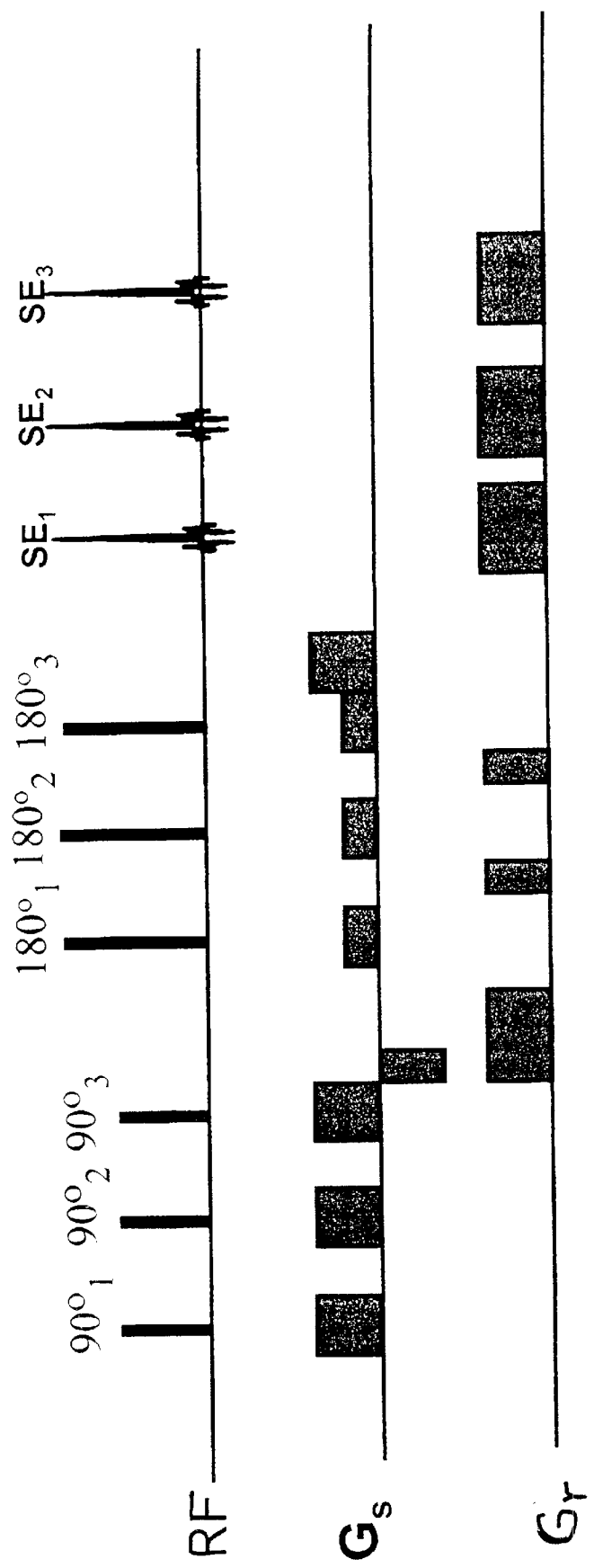
FIG. 1 illustrates prior art interleaved spin echo multi-slice imaging.

A new technique of multi-slice imaging is described which uses slice selective RF excitation and a simultaneous image refocusing (SIR) process. Multiple slice planes are refocused simultaneously after being excited independently. SIR differs from conventional multi-slice refocusing at lest in its timing of RF pulse excitation (Ex) and signal refocusing (R). Given image slices (s) located at different positions in 3D space: a) conventional multi-slice sequence timing involves Ex of s1, R of s1, Ex of s2, R of s2, while b) SIR multi-slice timing involves Ex of s1, Ex of s2, R of s1 and s2. SIR can be incorporated into pulse sequences generating either single echoes such as FLASH, SE, Gradient Echo, and more advantageously into echo train sequences such as EPI, RARE and GRASE.

If two different image planes are consecutively excited, their signals will be refocused and phase encoded together in each read gradient polarity switching in the EPI sequence. As a result, before the SIR approach described herein, the two sets of MRI signals would have been superimposed and inextricably combined. The SIR method causes the signals from each slice to occur adjacent to each other in each of several read periods. After data acquisition and "echo time reversal" the k-space data can be separated on the Kr axis into two halves. The resulting two k-spaces are independently 2D FT processed to give the two adjacent images.

In the time between two 90° excitation pulses, exciting different slices by means of frequency offsets, application of Gr pulses can only encode or dephase signal from the first excited slice. This is because signal in the second slice has not yet been created. Gradient pulses applied after the second 90° excitation pulse affect both signals equally. Using these principles, the two different signals can be separated through specific linear combinations of Gr dephasing pulses to accumulate desired differences in net phase shifts between signals. Two echoes from different slices refocused in a Gr readout period (period duration=1T) are centered on opposite halves at 0.25T and 0.75T by applying dephasing pulses with areas (time-amplitude) −0.5 T between the two RF excitation pulses and −0.25 T after the RF pulses. This assumes all Gr pulses have equal amplitude, otherwise the pulse durations need to scaled for equivalent area=T Gr.

Images of a phantom using SIR show identical slice separation and identical image quality and resolution as with conventional EPI. Some leakage of high spatial frequency signal that has very low energy in k-space can create a low intensity ghost in the image of edges on the frequency axis of the phantom. This effect can be reduced by increasing the separation of the signals or by placing a small spoiler pulses (on Gp and Gs) between the signals during their readout.

SIR applied to EPI and RARE sequences increases efficiency in the sequences, where efficiency is defined as net ADC signal sampling time per total sequence time. This is because the SIR sequence uses fewer gradient switchings and (more significantly) half as many time consuming phase encode and phase rewind pulses. The SNR and bandwidth can be maintained similar to the SNR of the conventional acquired images even though two slices are being acquired in the same time. Similarly, long diffusion gradients are reduced by two in time overhead during multi-slice imaging, for increased efficiency.

The potential advantages in EPI are increased efficiency (ADC sampling per sequence time) particularly when an initial preparatory period (PP) is used for diffusion or MRI BOLD contrast. The PP is used simultaneously by all encoded SIR slices.

Advantages of the SIR method can be seen in comparison to the method of interleaving spin echo slice acquisitions.

FIG. 1 shows the interleaving of three distinctly separate excitation, refocusing, and readout sequences which do not share simultaneous application of any of these three processes. In the case of a T2 weighted spin echo sequence, the large time delays between the three processes is used to interleave the independent creation of more slices. Three 180° RF pulses are used as each slice is independently refocused, and three readout gradients are used. The excitation pulses do not incorporate different combinations of gradient pulses between the RF excitation pulses as in SIR. There is no reduction of RF energy heating of the body since there is no reduction in the total number of RF pulses as in SIR technique. In FIG. 1, the TE of the signals is equal since they are interleaved identical sequences and share no commonality in refocusing, whereas the SIR technique creates spin echoes with different TE values.

Figure 2:
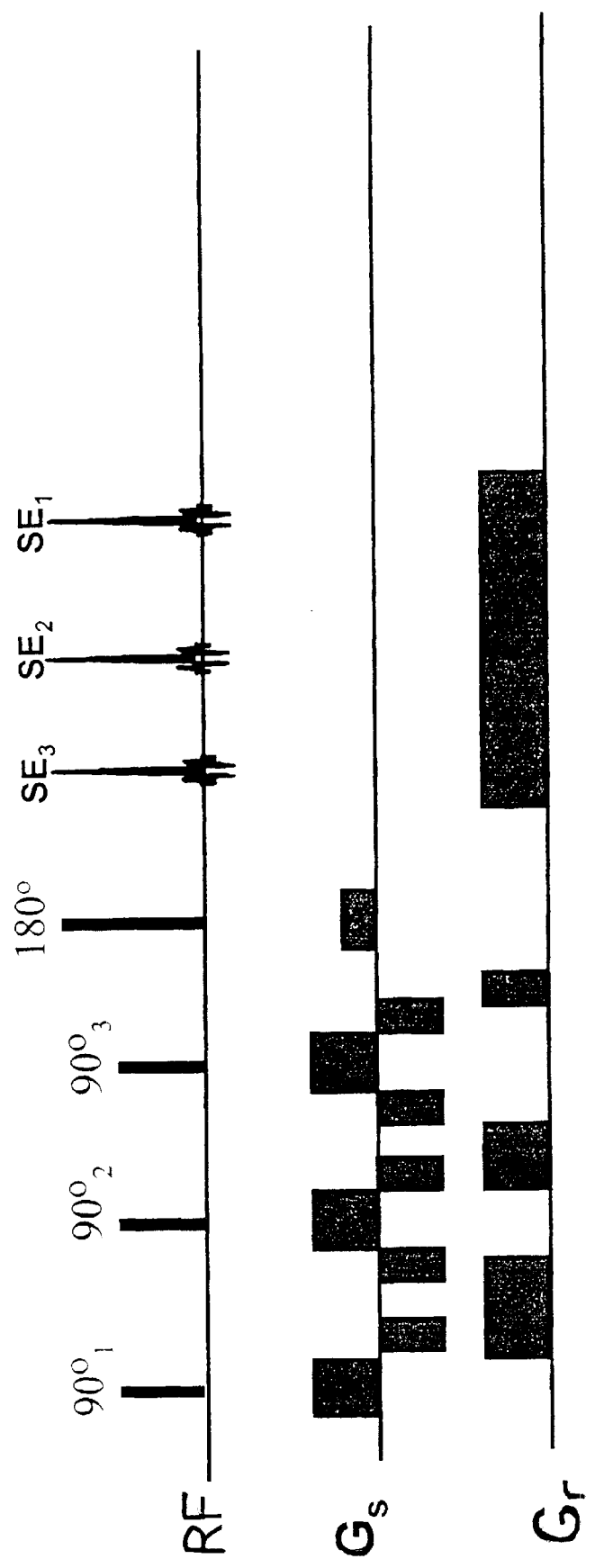
FIG. 2 illustrates the simultaneous image refocusing of three spin echoes.

FIG. 2 illustrates an exemplary SIR spin echo sequence generating three spin echoes each on a different slice. The three consecutively excited slices denoted ($90°_1$, $90°_2$, $90°_3$) are at different frequency offsets ($f_1$, $f_2$, $f_3$) to have NMR resonance at different positions on a so called slice-selective magnetic gradient (Gs), and this creates three spin echo signals ($SE_1$, $SE_2$, $SE_3$). Gradient pulses on the readout gradient axis (Gr) are applied with specific areas to give different phase histories to the three slices relative to the Gr direction and thus different later times of signal refocusing on one unipolar read gradient. A single 180° refocusing pulse is used with a weaker slice selective gradient so that its effective volume covers all three excitation planes. The phase encode pulses (Gp) can be applied in a standard Spin Warp technique before the Gr read period.

Figure 3:
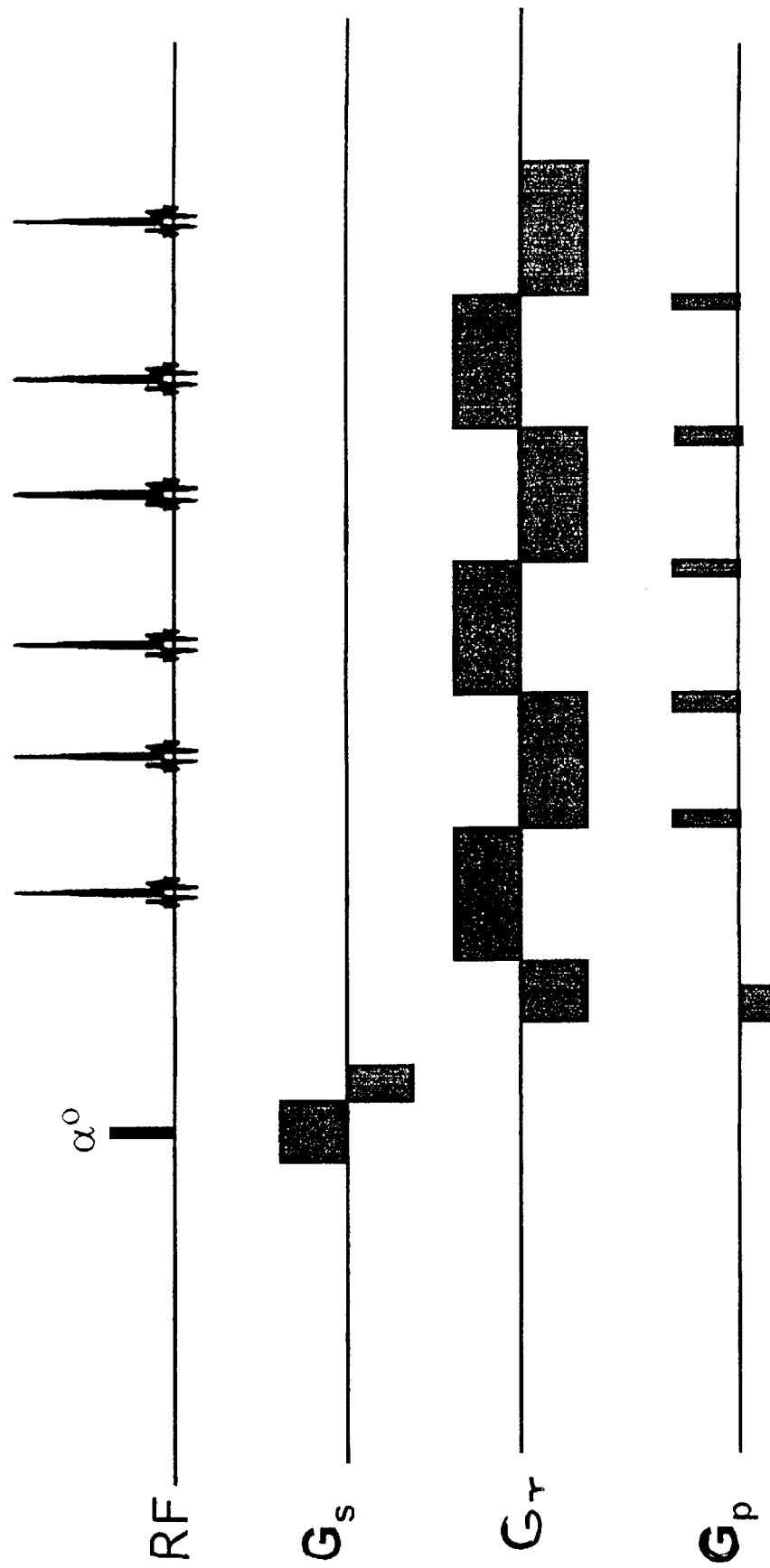
FIG. 3 illustrates a prior art EPI sequence.

FIG. 3 illustrates an echo planar image (EPI) sequence with "blipped" phase encode Gp pulses applied between the readout of its multiple signals.

Figure 4:
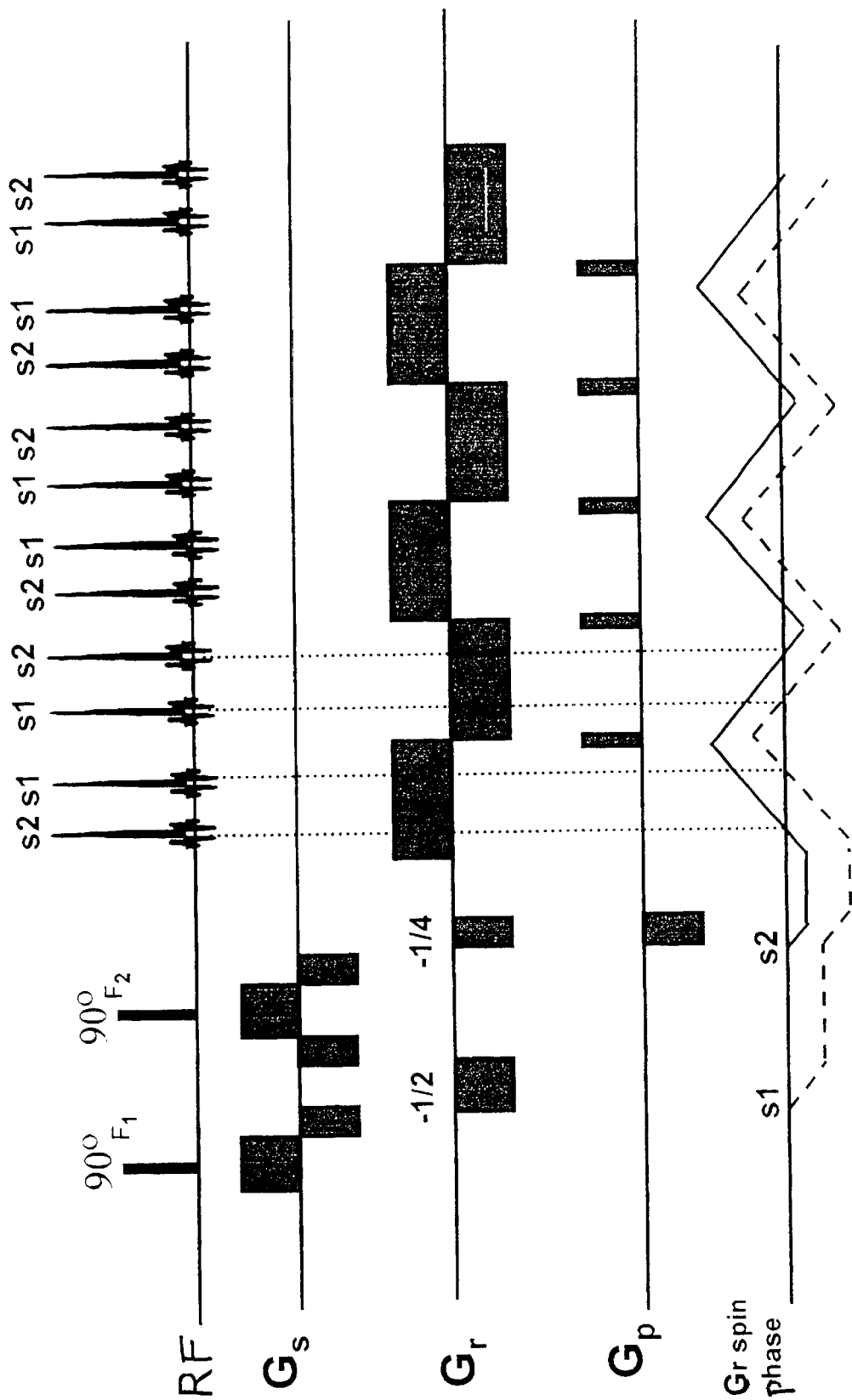
FIG. 4 illustrates a simultaneous image refocused EPI sequence.
Figure 5A:
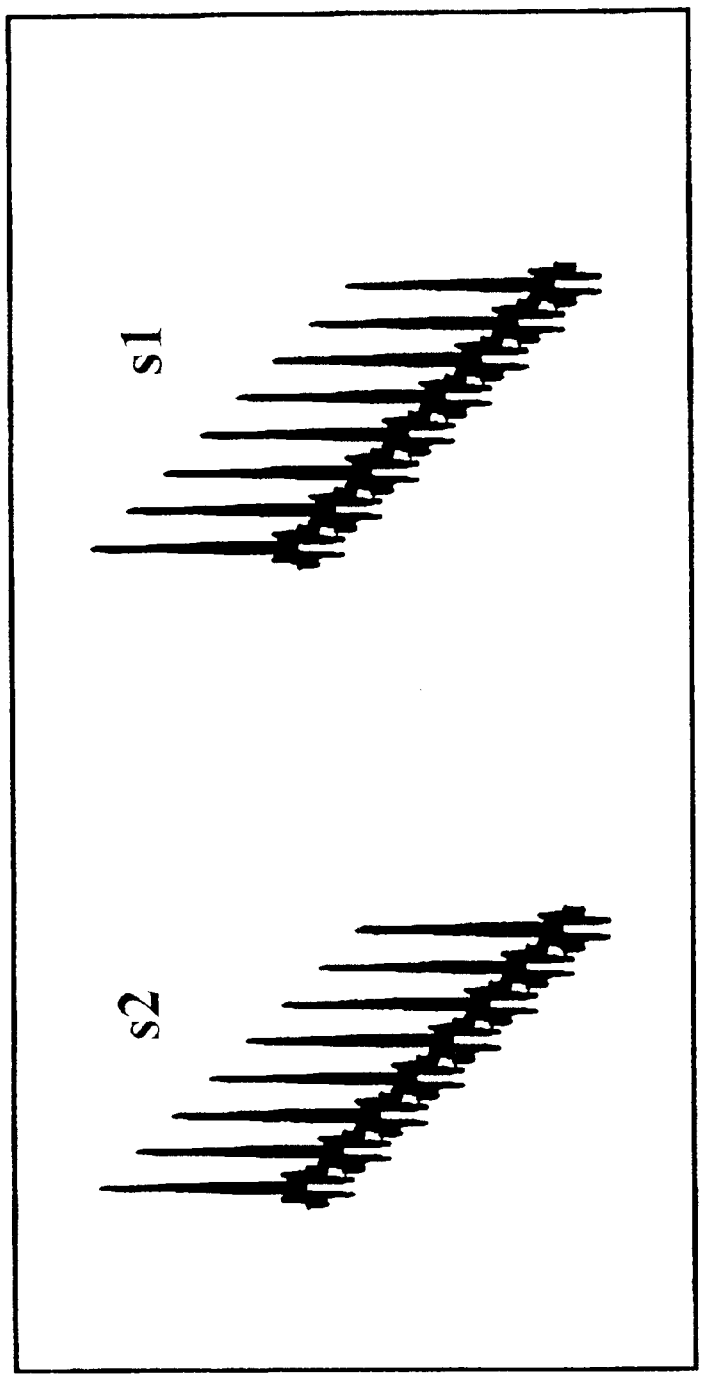
FIGS. 5A and 5B schematically depict the processing of image reconstruction with simultaneous refocused signals obtained in FIG. 4
Figure 5B:
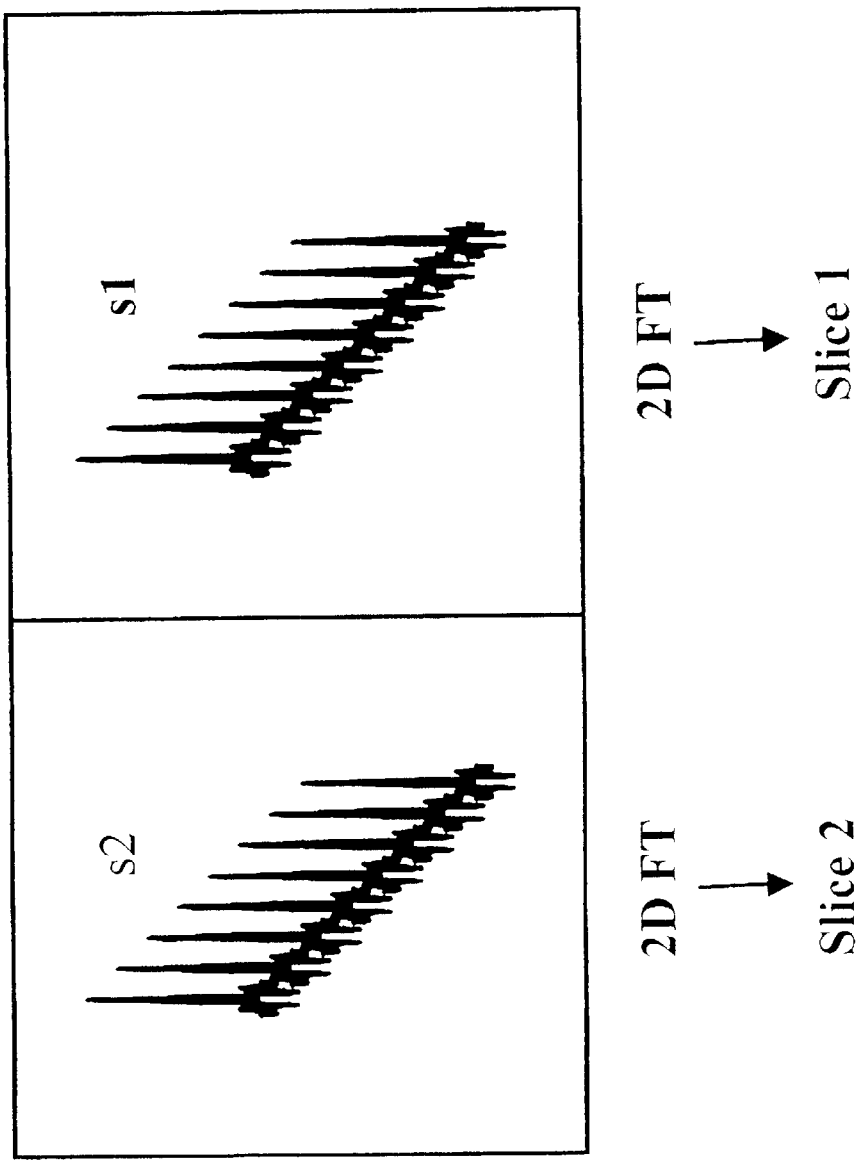

FIG. 4 illustrates in contrast an SIR EPI sequence encoding two slices. The signals (s1) are from the first excited image plane and the s2 signals are from the second 90° excited image plane. The s1 and s2 magnetization pathways create signals when they pass through null points (refocused) on the Gr spin phase graph shown. The s1 and s2 signals are centered at opposite halves of the Gr read periods. The s1 magnetization has the net sum of two dephasing gradients of relative effect −¾, whereas the s2 magnetization experiences −¼ dephasing. Therefore, defining the duration and net area of the Gr read period to be equal to 1, the s1 signal refocuses at a later time ¾ through the read period and the s2 signal refocuses at an earlier time ¼ through the read period. With subsequent EPI switched polarity Gr pulses, the s1 and s2 signals alternate in their order of null point refocusings, similarly alternating in their sides of occurrence on the Gr pulses. After time reversal of the alternate signals, those ADC sampled on the negative polarity Gr pulse, the resulting k-space (data matrix) is shown in FIG. 5A where the s1 and s2 signals are separated onto different halves of k-space. The data matrix can then be separated into two k-spaces for each of the different slices, FIG. 5B, and 2D FT image reconstruction is applied separately to each k-space data set to reconstruct slice 1 and slice 2.

Figure 6A:
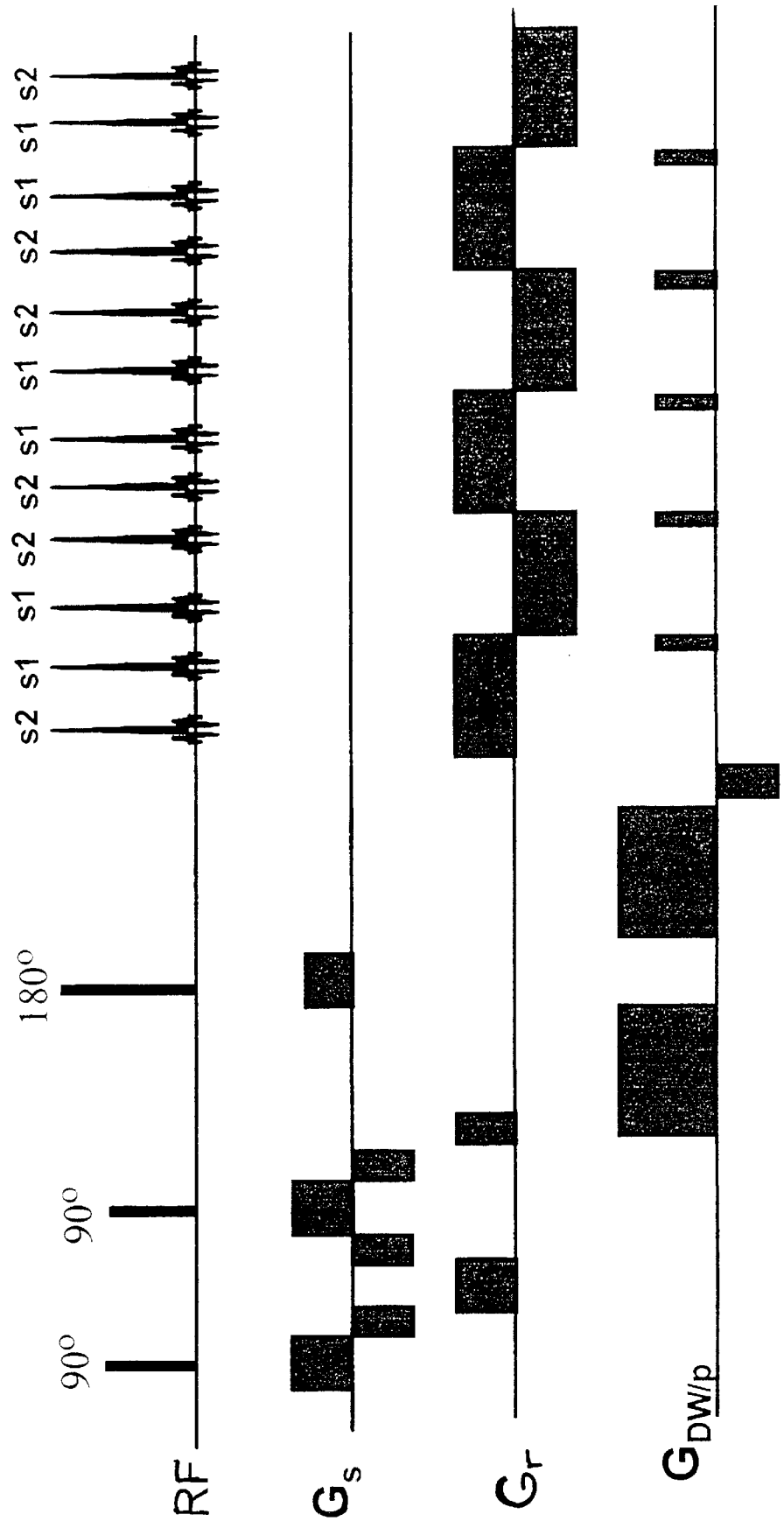
FIGS. 6A and 6B illustrate an exemplary diffusion weighted (DWI) and velocity encoded preparatory period in a simultaneous refocused EPI image sequence.
Figure 6B:
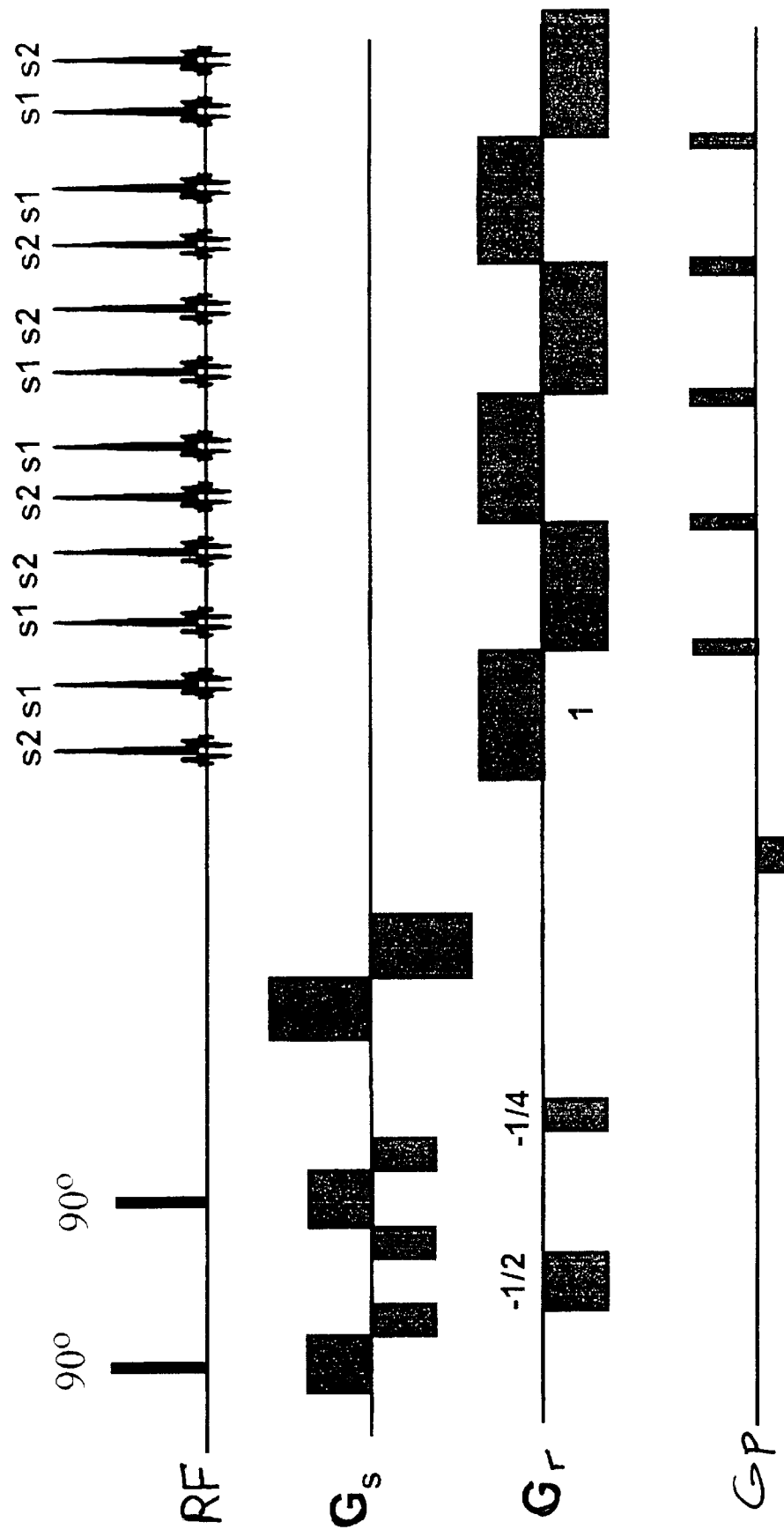

FIG. 6A illustrates a diffusion gradient sequence incorporated into the preparatory period of a two-slice SIR SE-EPI sequence. The gradients sensitization to diffusion requires long duration gradient pulses, not shown to scale in this diagram, and so the SIR time savings is quite substantial in clinical imaging or alternatively appreciated as providing more slices for more anatomic coverage, e.g., of the brain. FIG. 6B shows a bipolar gradient pulse applied on any arbitrary gradient axis to accomplish a velocity component measurement on the direction of the gradient axis. The velocity is encoded simultaneously on two image planes, which eliminates the temporal ambiguity of velocity when obtaining measurement with different space-time relationship of two conventional EPI images.

Figure 7A:
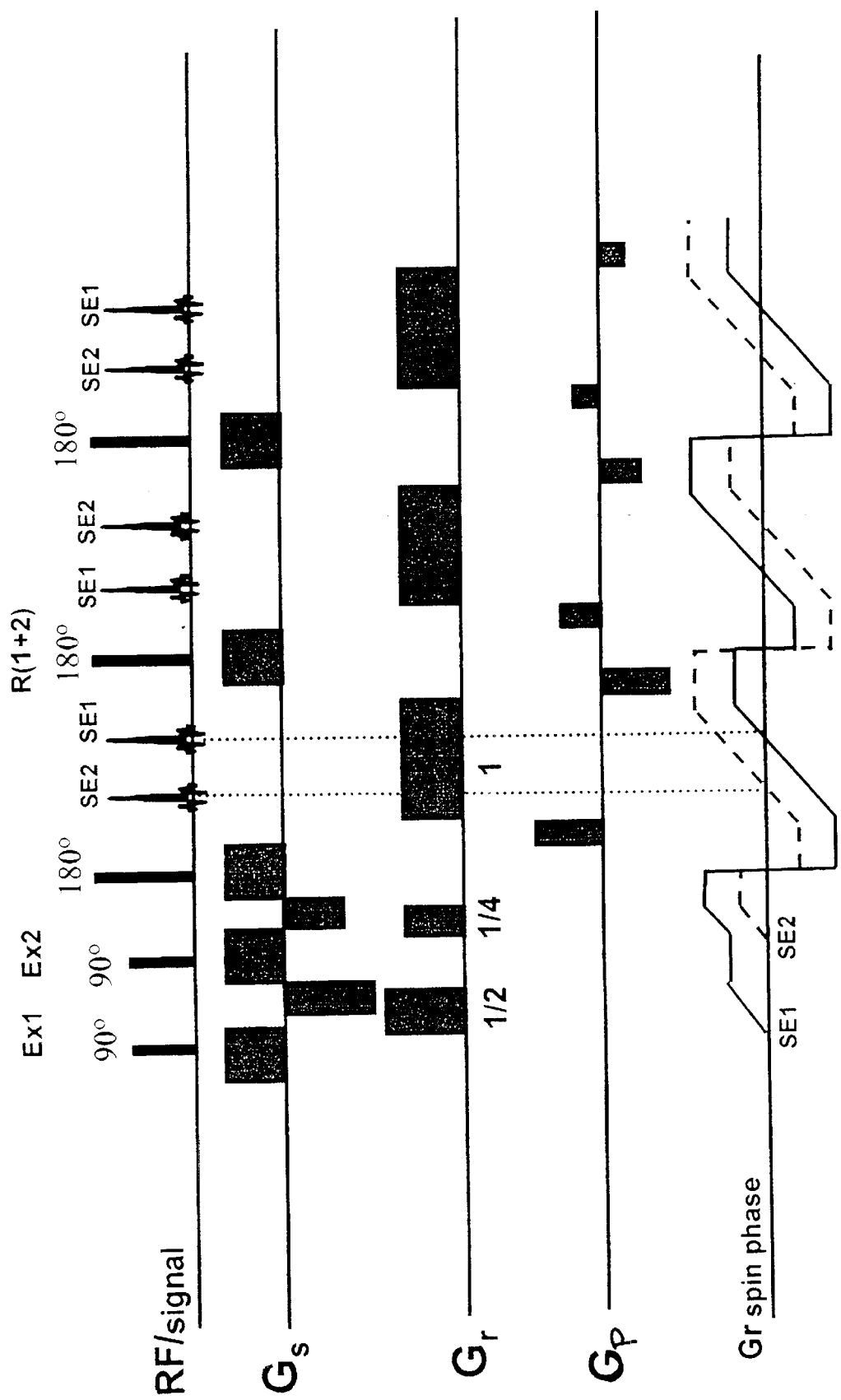
FIGS. 7A and 7B illustrate a SIR multiple spin echo sequence with gradient phase timing plot.
Figure 7B:
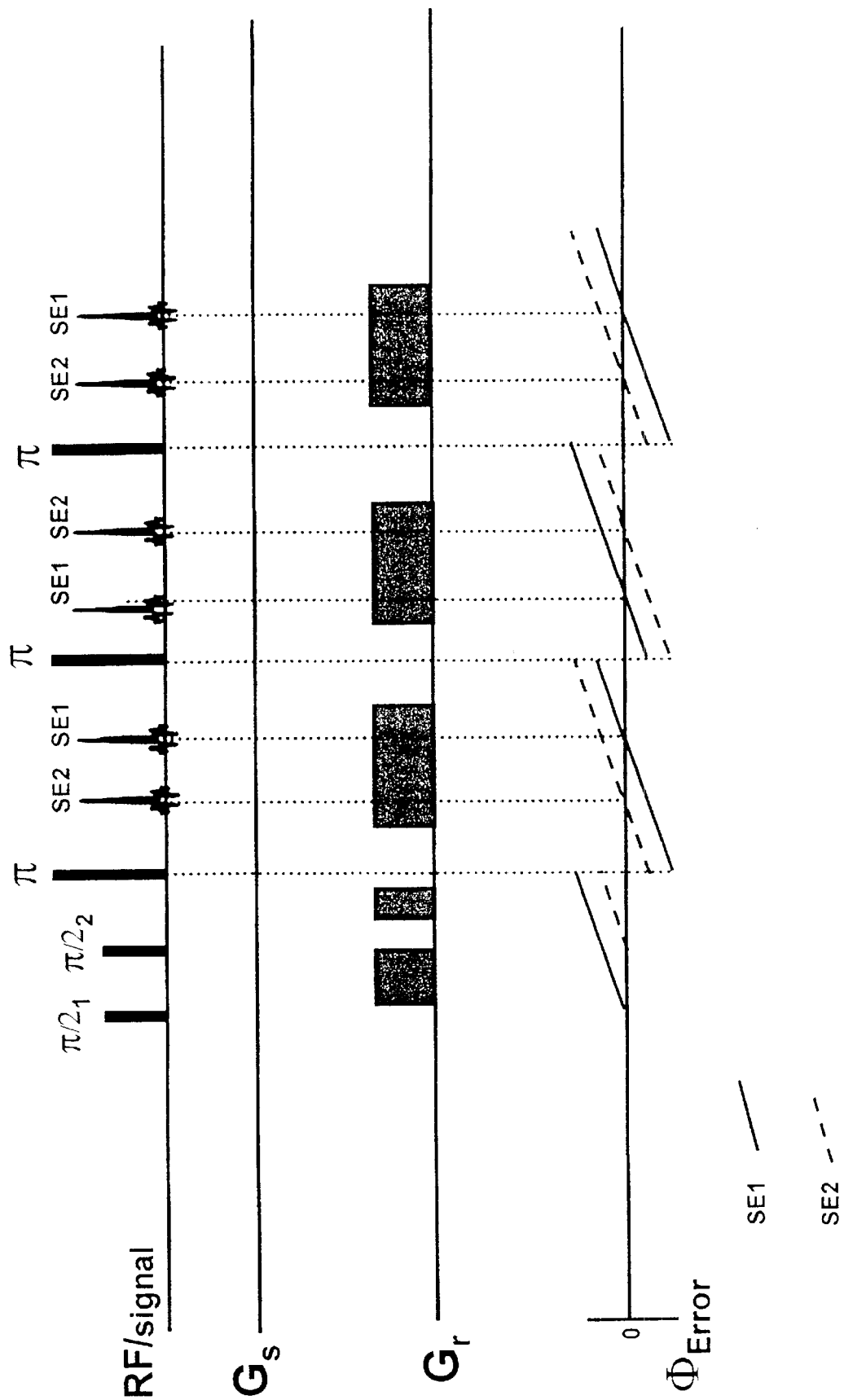

FIG. 7A illustrates a RARE sequence modified for a two-slice SIR technique. The Gr gradient dephase and rephase position the spin echoes from the first excited slice (SE1) and second slice (SE2) onto different halves of the read periods. With appropriate timing as shown in FIG. 8, the SIR sequence creates multiple spin echoes (not gradient echoes) between the 180° refocusing pulses. To create only spin echoes, the signal magnetization from the two slices are forced, with appropriate timing of read gradients, to undergo gradient refocusing at null points on the Φerror time plot, as illustrated in FIG. 7B, where the off-resonant phase errors have contributions from Bo field inhomogeneity errors, susceptibility and RF off-resonance errors.

FIG. 9 illustrates SIR applied to an STE sequence. A first RF pulse 90° (1+2) excites both slices s1 and s2. A first Gr dephasing gradient of area ¼ the area of a normal readout pulse on the Gr axis encodes the signals from both slices. A second, more selective 90°(1) pulse stores the signals from slice s1 but not from slice s2 on the longitudinal axis. A second Gr dephasing gradient of area ½ the area of the normal readout pulse is applied and encodes only the signals from slice s2 (because slice s1 has experienced two 90° pulses and is stored on the longitudinal axes). A third 90°(2) pulse stores the signals from slice s2 on the longitudinal axis. A fourth 90°(1+2) pulse affecting both slices s1 and s2 returns to the transverse axis (or refocuses) the signals from both slices s1 and s2. The signals can be read out by EPI alternation of Gr polarity pulses, creating an alternating order of signals from slices s1 and s2 (1, 2, 2, 1, 1, 2, 2, . . . ). Additional Gp slice encoding gradients can be applied during the echo train, in the conventional way, to encode each set of signals from s1 and s2 differently for 2D FT. This method of SIR STE can be generalized to more than two simultaneously refocused slices. Also, the order of Gr encoding can be changed, e.g., the first Gr dephasing pulse can be applied with opposite polarity immediately after the fourth 90° pulse and have same or comparable effect.

The simultaneous images refocused (SIR) technique is believed to be most successful, at least in part, because of three preferred features of the exemplary image sequence (which may be performed in various subcombinations and permutations).

What is claimed is:

1. An MRI process comprising:
   giving each of a number of excited slices a respective phase history different from those of the other slices;
   simultaneously refocusing the slices;
   acquiring MRI signals from the slices at respective different times related to their respective different phase histories; and
   using the MRI signals to reconstruct respective images of the slices.

2. An MRI process as in claim 1 in which the slices are excited sequentially in time.

3. An MRI process as in claim 1 in which the step of giving the slices respective different phase histories comprises applying energy to the slices on a readout gradient axis after the excitation of one but before the excitation of another one of the slices.

4. An MRI process as in claim 1 in which the step of simultaneously refocusing the slices comprises applying refocusing energy to the slices after the excitation of all slices.

5. An MRI process as in claim 1 in which the step of giving each slice a respective phase history comprises giving the slices spin phases conforming to waveforms having peaks that coincide in time but zero crossovers that are spaced in time for the different slices.

6. An MRI process as in claim 1 in which the step of acquiring the MRI signals comprises alternating the order of MRI signals from the slices so that in the case of two slices s1 and s2, the order comprises s1, s2, s2, s1, s1, s2, etc.

7. An MRI process as in claim 1 in which the step of giving each slice a respective phase history comprises creating a first excited slice, then applying dephasing energy to the first slice, then creating a second excited slice, and then dephasing energy to both the first and the second slice.

8. An MRI process as in claim 1 in which the step of using the MRI signals comprises storing data related to the MRI signals for the different slices in k-space, separating the stored data by location along a kr axis, and reconstructing respective slice images from the so-separated data.

9. An MRI process as in claim 1 applied to a spin echo pulse sequence wherein the step of giving each excited slice a respective phase history comprises exciting a first one of the slices with an RF excitation pulse while in the presence of a main magnetic field and a slice selection magnetic gradient, then applying dephasing energy to the first slice, and then exciting a second one of the slices with an RF excitation pulse in the presence of the main magnetic field and a slice selection magnetic gradient, before carrying out the step of simultaneously refocusing the slices.

10. An MRI process as in claim 1 applied to an echo planar imaging pulse sequence wherein the step of giving each excited slice a respective phase history comprises exciting a first one of the slices with an RF excitation pulse while in the presence of a main magnetic field and a slice selection magnetic gradient, then applying dephasing energy to the first slice, and then exciting a second one of the slices with an RF excitation pulse in the presence of the main magnetic field and a slice selection magnetic gradient, before carrying out the step of simultaneously refocusing the slices, and wherein the step of acquiring the MRI signals comprises alternating the order of acquiring the MRI signals from the first and second slices.

11. An MRI process as in claim 1 including simultaneously encoding a physical parameter in the slices.

12. An MRI process as in claim 11 in which the step of simultaneously encoding a physical parameter comprises velocity encoding.

13. An MRI process as in claim 11 in which the step of simultaneously encoding a physical parameter comprises diffusion encoding.

14. An MRI process as in claim 1 applied to a RARE pulse sequence wherein the step of giving each excited slice a respective phase history comprises exciting a first one of the slices with an RF excitation pulse while in the presence of a main magnetic field and a slice selection magnetic gradient, then applying dephasing energy to the first slice, and then exciting a second one of the slices with an RF excitation pulse in the presence of the main magnetic field and a slice selection magnetic gradient, and wherein the step of simultaneously refocusing the slices comprises repeatedly refocusing the slices after an MRI signal is acquired from each slice.

15. An MRI process comprising:
    encoding a physical parameter in a number of slices simultaneously;
    causing the slices to emit respective MRI signals at different times; and
    using said MRI signals to form respective images of the slices.

16. An MRI process as in claim 1 in which the physical parameter comprises one of diffusion and velocity.

17. An MRI process comprising:
    simultaneously exciting a number of slices of a body in a main magnetic field, said slices being in planes transverse to a longitudinal axis;
    applying first dephasing energy to the slices;
    applying additional excitation energy to only a first one of the slices to store signals from the first slice on the longitudinal axis;
    applying second dephasing energy to encode a second one but not the first one of the slices;
    applying additional excitation energy to store signals from the second slice on the longitudinal axis;
    applying additional excitation energy to refocus both the first and second slices;
    reading MRI signals from the first and second slices.

18. An MRI process comprising:
    creating two slices that have different spin phase histories;
    applying energy affecting both slices;
    acquiring MRI signals from the two slices at times related to their different phase histories.

19. An MRI process as in claim 1 in which the step applying energy comprises simultaneously applying refocusing energy to the two slices.

* * * * *